(12) United States Patent
Schneider et al.

(10) Patent No.: US 11,629,049 B2
(45) Date of Patent: Apr. 18, 2023

(54) METHOD FOR PRODUCING A MOLDED BODY

(71) Applicant: Karlsruher Institut für Technologie, Karlsruhe (DE)

(72) Inventors: Norbert Schneider, Schwetzingen (DE); Christian Koos, Siegelsbach (DE); Matthias Worgull, Stutensee (DE); Philipp-Immanuel Dietrich, Wörth (DE)

(73) Assignee: Karlsruher Institut fur Technologie, Karlsruhe (DE)

( * ) Notice: Subject to any disclaimer, the term of this patent is extended or adjusted under 35 U.S.C. 154(b) by 0 days.

(21) Appl. No.: 17/250,087

(22) PCT Filed: May 24, 2019

(86) PCT No.: PCT/EP2019/063451
§ 371 (c)(1),
(2) Date: Nov. 23, 2020

(87) PCT Pub. No.: WO2019/224349
PCT Pub. Date: Nov. 28, 2019

(65) Prior Publication Data
US 2021/0179424 A1   Jun. 17, 2021

(30) Foreign Application Priority Data

May 25, 2018 (DE) .......................... 102018208273.1

(51) Int. Cl.
*B29C 59/02* (2006.01)
*B81C 99/00* (2010.01)
*B29C 59/00* (2006.01)
*B29K 505/00* (2006.01)
*B29K 509/00* (2006.01)
*B29L 11/00* (2006.01)

(52) U.S. Cl.
CPC ........ *B81C 99/0095* (2013.01); *B29C 59/005* (2013.01); *B29C 59/022* (2013.01); *B29C 2059/023* (2013.01); *B29K 2505/00* (2013.01); *B29K 2509/00* (2013.01); *B29K 2995/0012* (2013.01); *B29K 2995/0018* (2013.01); *B29L 2011/0016* (2013.01); *B81C 2201/034* (2013.01)

(58) Field of Classification Search
CPC ................ B29K 59/005; B29K 59/022; B29K 2995/0012
USPC ........................................................ 264/241
See application file for complete search history.

(56) References Cited

U.S. PATENT DOCUMENTS

2010/0123270 A1   5/2010   Owens et al.

FOREIGN PATENT DOCUMENTS

| DE | 102007061342 A1 | 6/2009 |
| DE | 102013022181 A1 | 7/2015 |
| DE | 102014110149 A1 | 1/2016 |
| JP | H02274526 A | 11/1990 |

OTHER PUBLICATIONS

English translation of JP2-274526 (Year: 1990).*
Schneider, Norbed et al., "Nanothermoforming of Hierarchical Optical Components Utilitzing Shape Memory Polymers as Active Molds". Optical Materials Express. Bd. 4, Nr. 9, 20., Aug. 31, 2014.
Meier, Tobias et al., "Programmable and Self-Demolding Microstructured Molds Fabricated From Shape-Memory Polymers" Journal of Micromechanics and Microengineering. 9 pages., May 19, 2015.
Lendlein, A. et al., "Shape-Memory Polymers". Reference Module in Materials Science and Materials Engineering. 12 pages., Jan. 1, 2016.
Safranski, David L. et al., "Introduction to Shape-Memory Polymers". Elsevier Science and Technology Books. 22 pages., Dec. 31, 2017.
PCT, International Patent Application PCT/EP2019/063451 Translation of International Preliminary Report on Patentability. 19 pages., Dec. 1, 2020.

* cited by examiner

*Primary Examiner* — Jeffrey M Wollschlager
*Assistant Examiner* — Xue H Liu
(74) *Attorney, Agent, or Firm* — Woodard, Emhardt, Henry, Reeves & Wagner, LLP

(57) ABSTRACT

The present invention relates to a method for producing a molded body (10), comprising the following steps:

a) providing a molding tool (40) which has at least one receptacle (12) in which at least one material (30) which comprises at least one shape-memory material (31) is introduced, wherein the shape-memory material (31) is present in a first state (111), wherein the material (30) at least partially fills the receptacle (12) of the molding tool (40) in such a manner that said material adjoins at least one surface of the receptacle (12);

b) creating a molded body (10) in the receptacle (12) of the molding tool (40) from the material (30), wherein the shape-memory material (31) is present in a second state (112), wherein a form (11) is embossed into the molded body (10) during the second state (112);

c) transferring the shape-memory material (31) to a third state (113), wherein the molded body (10) can be deformed during the third state (113) in such a manner that the molded body (10) is demolded from the receptacle (12) of the molding tool (40); and d) at least partially restoring the form (11) of the molded body (10) by transferring the shape-memory material (31) to a fourth state (114), wherein the molded body (10) at least partially resumes the form (11) according to step b) during the fourth state (114).

12 Claims, 4 Drawing Sheets

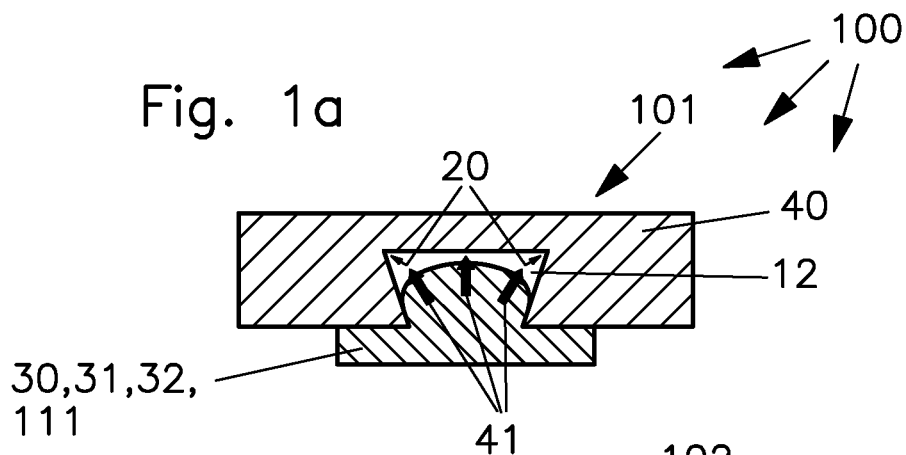
Fig. 1a
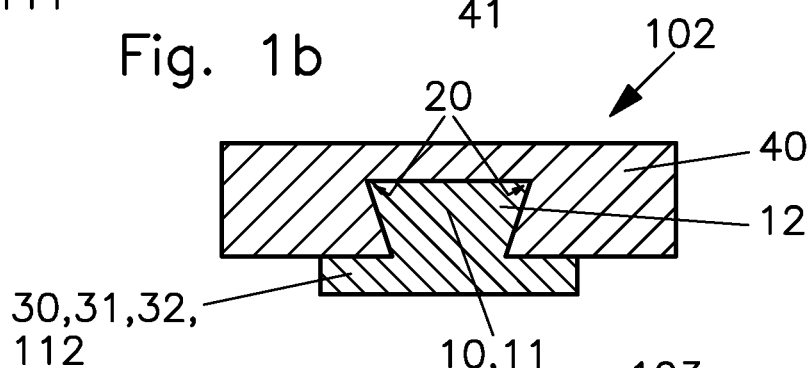
Fig. 1b
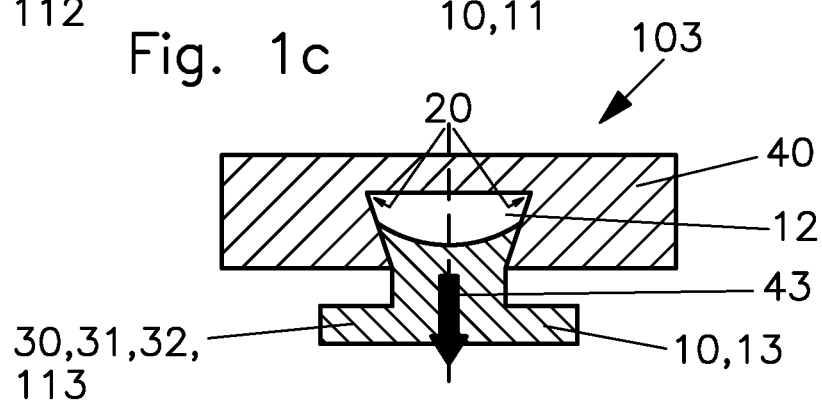
Fig. 1c
Fig. 1d
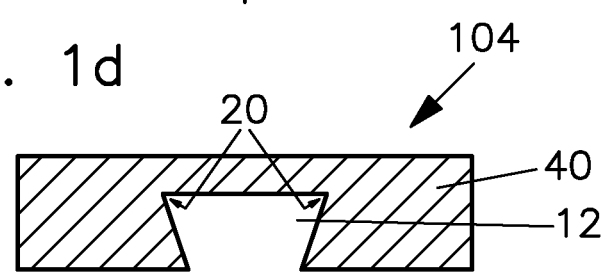
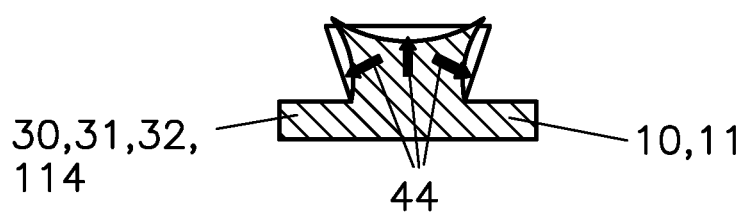

METHOD FOR PRODUCING A MOLDED BODY

FIELD OF THE INVENTION

The present invention is in the field of the manufacture of structures, in particular microstructures, and relates to a method for producing a molded body and to a molded body that can be produced by this method. Methods of this type are preferably suitable for producing optical or micro-optical components, but in addition can also be used in other areas of application.

PRIOR ART

Manufacturing methods for structures, in particular for microstructures, that are known from the prior art can be subdivided on the one hand into additive manufacturing methods, which are configured to build up structures in layers and which include, in particular, 3D printing or two-photon lithography, and on the other hand into primary forming or shaping methods, which are provided for the primary forming or shaping of a given material and include, in particular, hot embossing, nanoimprinting and injection molding. Significant differences between these two types of manufacturing methods lie in a freedom of shaping the structures to be produced, a manufacturing time and thus also the costs per item, and in part in the possible overall sizes of the structures.

Additive manufacturing methods generally produce the desired structures in layers and as result create said structures in one main direction. Almost any desired structure can be produced in this way, the overall size being delimited by what is known as a "writing field" and the minimum resolution generally being delimited by the material used. In addition, there may be further restrictions, for instance in two-photon lithography the option of focusing a laser used as a writing beam in all three spatial directions.

Manufacturing methods in which primary forming or shaping of materials takes place are often based on a tool which has a negative structure, which is transferred inversely to the material. In this respect, the negative structure can be transferred to the material in a receptacle of the tool by melting the material or by hardening a hardenable material, for instance by polymerizing a monomer. Manufacturing methods of this type allow a high throughput and are therefore particularly economical. Significant restrictions of these methods lie in high costs for the production of the respective tool and also in limitations with regard to the geometries that can be produced. A significantly limiting production step here is what is known as a "demolding operation", in which the molded body produced from the material is removed from the tool.

After a material has received its form in the molding tool, the molded body produced in this way must be released from the molding tool. This is done by moving the molded body in what is known as a "demolding direction", which can also be referred to as a "demolding axis", which is preferably selected in such a manner that the molded body and the molding tool can be separated from one another as far as possible without impediments. However, the movement of the molded body in the demolding direction can significantly restrict the geometry of the molded body, since for this purpose the molded body must not have an undercut with respect to the demolding direction. The term "undercut" refers here to a part of the molded body which cannot be demolded from the molding tool in the demolding direction. In particular, those parts of a molded body for which there is no demolding direction can be referred to as undercuts. The structures to be formed are thus restricted to those forms that do not have any undercuts. These include what are known as "2.5D structures", which result from a projection of a 2D form, such as for example meshes, columns or channels for microfluidics. Furthermore, structures which can be demolded along a plurality of demolding axes, for example tapering structures such as pyramids or cones, can be molded. Irregular structures can also be molded, provided that all structures of the molded body have at least one common demolding axis. In practical applications, the demolding axis is selected generally as orthogonal to a surface of the molding tool, in particular in order to prevent shear forces during the demolding operation.

To produce structures having undercuts, the use of soft imprinting methods or a hierarchical molding method is known.

In the case of what is known as the soft imprinting method, a molding tool, which can also be referred to as a "mold insert", is usually introduced, for which soft plastics, preferably a silicone, in particular polydimethylsiloxane (PDMS), are used. On account of the elastic deformability of the soft plastic, the molding tool can deflect during the demolding operation and thus prevent damage to the molded body. In this way, geometries with undercuts can also be produced. However, molding tools of this type are not as resistant as molding tools which comprise a solid body, in particular of metal or silicon, and therefore become worn usually considerably already after a few molding operations. A new molding tool is thus required, which firstly has to be produced by usually cost-intensive methods. Furthermore, elastic mold inserts considerably restrict the selection of moldable materials on account of a low temperature resistance. In addition, elastic mold inserts do not achieve the dimensional accuracy considered to be self-evident in the case of metallic molding tools. This is due to the fact that the elastic molding tool is not only deformed during the demolding operation, but rather already during the filling of the receptacles of the molding tool, which are also referred to as "cavities". In particular for optical applications, these deviations are generally not acceptable since they can considerably impair the function of an optical component.

UV imprinting methods, in which a usually liquid monomer is poured into the cavities of the molding tool and fully polymerized under irradiation with ultraviolet light, constitute a modification thereto. Both the demolding operation and the restrictions described above of solid mold inserts remain unchanged. In addition, on account of their function, photoinitiators that are optionally present have a strong absorption in certain wavelength ranges, in particular in the UV range, which are still present even after successful polymerization and can interfere with the transmission at these wavelengths.

The hierarchical molding method is composed of a combination of hot embossing and thermoforming. In this respect, firstly the surface of a film, in particular a polymer film, is modified, as a result of which the first hierarchical stage is created. After this, the film as a whole is deformed, as a result of which the second hierarchical stage is created, it being possible for the surface structures to be oriented partially horizontally. One advantage is applicability to a large number of technical polymers; however, there are restrictions with regard to the geometries that can be produced. The hierarchical structure has to be composed of individual structures with clearly distinguishable size scales. If this requirement is not met, as for example in the case of upright standing lenses, this method cannot be used or can be used only with considerable outlay. The structures that can be produced by this method additionally have restrictions with regard to introducing undercuts. Although the described combination can overcome restrictions of hot embossing, the hot embossing step remains limited to structures without undercuts. In addition, the precision of the components is determined by the process that operates on the larger size scale and may therefore under certain circumstances not achieve the specifications required for optical components.

DE 10 2014 110 149 A1 discloses a method for producing a molded body and a molded body produced by this method, in which a structured composite is applied to a heat-conductive plate. After this, the plate is heated to the glass transition temperature of the polymer and below the permanent deformation temperature of the shape-memory polymer, the result being a molded body comprising the deformed structured polymer film and the structured foil. The molded body can be used in particular for the production of antireflection coatings, colored areas that are free from coloring pigments, or microchannels having structured walls. The restrictions mentioned with respect to hierarchical molding methods also apply to this.

DE 10 2013 022 181 A1 discloses a mold insert and a method for producing a microstructured and/or nanostructured, three-dimensionally formed molded part using a shape-memory material. In this respect, the molding tool comprises a shape-memory material and has surface structures in a temporary form of the shape-memory material. A hardenable substance is poured over the molding tool and hardens on the molding tool. Subsequently, the shape-memory effect is activated and the shape-memory material returns to a flat form in its stable state. In this way, the surface structures of the molding tool can be pulled out of the finished component. However, this method cannot be applied directly to surface structures having undercuts, since the molding tool must be in its temporary form already during the molding operation.

DE 10 2007 061 342 A1 discloses an article of a shape-memory composite material which comprises a shape-memory polymer and also a magnetic material which is embedded therein and can be present in the form of particles, wherein, after thermomechanical programming, the shape-memory polymer is able to implement at least one form transition from a temporary form to a permanent form when induced by temperature; a method for producing said article, and a method for retrieving stored forms. The article has at least two portions which are connected to one another and differ by a surface/volume ratio. However, it does not describe the production of structures having undercuts.

US 2010/0123270 A1 discloses a further method for producing structures having undercuts. For this purpose, a shape-memory polymer is introduced into a projection of a cavity of a component, the shape-memory polymer having the form of the undercut as a temporary form and a form in which it can be demolded from the undercut as a permanent form. The shape-memory polymer can thus be used as a tool which, by virtue of a switching operation, is transferred to a geometry that can be demolded from the manufactured component.

OBJECT OF THE INVENTION

Proceeding from this, the object of the present invention consists in providing a method for producing a molded body and also a molded body that can be produced by this method, which at least partially overcome the specified disadvantages and restrictions of the prior art.

In particular, the intention is to specify a production method which combines the advantages both of the additive manufacturing methods and the forming methods and as a result makes it possible to quickly and cost-effectively produce structures that up to now could not be produced economically. In addition, the intention is that the method can be used on already available devices, in particular injection molding or hot embossing machines, as a result of which complex retrofitting of the devices can be omitted.

DISCLOSURE OF THE INVENTION

This object is achieved by a method for producing a molded body and also a molded body that can be produced by this method, having the features of the independent patent claims. Advantageous refinements, which can be implemented individually or in any desired combination, are illustrated in the dependent claims.

In the following text, the terms "have", "comprise" or "include", or any grammatical variations thereof, are used in a non-exclusive manner. Accordingly, these terms may relate both to situations in which there are no further features apart from the features introduced by these terms, or to situations in which there is or are one or more further features. For example, the expression "A has B", "A comprises B" or "A includes B" may relate both to the situation in which, apart from B, there is no further element in A (i.e. to a situation in which A consists exclusively of B) and to the situation in which, in addition to B, there are one or more further elements in A, for example element C, elements C and D or even further elements.

It is also pointed out that the terms "at least one" and "one or more" and also grammatical variations of these terms, when they are used in connection with one or more elements or features, are intended to express that the element or feature may be provided one or more times but is generally used only once, for example when the feature or element is introduced for the first time. When the feature or element is subsequently mentioned again, the corresponding term "at least one" or "one or more" is generally no longer used, without restricting the possibility that the feature or element may be provided one or more times.

Furthermore, in the following text the terms "preferably", "in particular", "for example" or similar terms are used in connection with optional features, without alternative embodiments being restricted thereby. Thus, features that are introduced by these terms are optional features, and it is not intended for these features to restrict the scope of protection of the claims, and in particular of the independent claims. Thus, as a person skilled in the art will appreciate, the invention can also be carried out using other embodiments. In a similar way, features that are introduced by "in one embodiment of the invention" or by "in one exemplary embodiment of the invention" are understood to be optional features, without it being intended that alternative embodiments or the scope of protection of the independent claims are/is restricted thereby. Furthermore, all of the possibilities of combining the features thereby introduced with other features, whether optional or non-optional features, are intended to remain unaffected by these introductory expressions.

In a first aspect, the present invention relates to a method for producing a molded body. In this respect, the method according to the invention comprises the following steps a) to d), which are preferably carried out in the sequence indicated, it also being possible for successive steps to be carried out at least partially at the same time. They can also be supplemented by further steps which may be carried out before, after and/or during one of the steps indicated:

a) a molding tool which has at least one receptacle in which at least one material is introduced, wherein the material comprises at least one shape-memory material, wherein the shape-memory material is present in a first state, wherein the material at least partially fills the receptacle of the molding tool in such a manner that said material adjoins at least one surface of the receptacle;

b) creating a molded body in the receptacle of the molding tool from the material, wherein the shape-memory material is present in a second state, wherein a form is embossed into the molded body during the second state;

c) transferring the shape-memory material from the second state to a third state, wherein the molded body can be deformed during the third state in such a manner that the molded body is demolded from the receptacle of the molding tool; and d) at least partially restoring the form of the molded body by transferring the shape-memory material from the third state to a fourth state, wherein the molded body at least partially resumes the form according to step b) during the fourth state.

The present method therefore consists in a close coordination of properties of the shape-memory material with the proposed method steps. In this respect, the term "shape-memory material" describes a solid body which has what is known as the "shape-memory effect", which has the effect that the solid body can change its external form either autonomously or by virtue of outside action. Shape-memory materials are generally available and known to a person skilled in the art, see e.g. Angew. Chem. 114, 2002, pp. 2138 to 2162.

The shape-memory materials thus have at least two states of the solid body that are different from one another, can be set individually and, by virtue of a corresponding setting, generally bring about a change in the form of the solid body, it being possible for the change in the form of the solid body to occur either autonomously or by virtue of an outside action on the solid body. These states, which are different from one another, are distinguished in that different forms can be predefined for the shape-memory materials in the different states, the different forms at least partially remaining able to be restored, even after later deformations in other states. This can frequently be brought about by a suitable molecular structure of the shape-memory material. The form of the shape-memory material that is stored in an individual state can thus be restored at a later point in time by bringing the shape-memory material into a corresponding other state or by bringing about a return to a previously stored form by virtue of an outside action. As far as the return to the previously stored form, the shape-memory material also has at least one further state in which at least one of the stored forms is stable and retains the associated form until restoration.

Regardless of its composition, in what is known as a "temporary state", the shape-memory material retains a given form which can also be referred to as a "temporary form", until it is prompted to autonomously assume another form. This type of autonomous form change, which is also referred to as the "return", can be brought about by an outside action, as a result of which the shape-memory material is brought into a corresponding state. In general, shape-memory materials can have a plurality of temporary states.

By contrast with this, the shape-memory material can have what is known as a "permanent state" in which the shape-memory material assumes a permanent form, which is also referred to as a "permanent form", or into which the shape-memory material can be transferred by virtue of at least one outside action on account of the shape-memory effect. However, there exists neither a state nor an outside action which could cause the shape-memory material to autonomously transfer into another form proceeding from the permanent form. On the other hand, however, temperature-sensitive shape-memory materials can autonomously undergo a transition into the permanent form proceeding from a temporary form, in particular by virtue of heating to at least a fixed temperature range.

According to the invention, regardless of its molecular composition, the shape-memory material can have one of the following states:

Stable state: In what is known as a "stable state", the material comprising the shape-memory material is dimensionally stable. The term "dimensionally stable" refers to the fact that the material retains an existing or predefined form provided that no outside actions act on it. In this respect, an "outside action" refers in particular to a change in temperature or an action of an electrical and/or magnetic field, in particular an electrical voltage or an electrical current, an electromagnetic field, in particular from light from the ultraviolet, visible and/or infrared spectral range, from local or two-dimensional forces, in particular from pressure fluctuations; from particle radiations or from chemical substances, in particular from solvents, on at least a part of the surface of the material. Excluding outside actions of this type, the material retains its predefined form, preferably permanently. The material preferably has the stable state in standard conditions. In this respect, the term "standard conditions" refers to an ambient temperature of 20° C. and an air pressure of 1013 hPa.

First state: In what is known as a "first state", the material comprising the shape-memory material is less dimensionally stable than the molding tool used; it is therefore also referred to as "softer" than the molding tool. In particular, an action of force between the material and the molding tool preferably does not lead to deformations of the molding tool, but rather of the material; the material therefore at least experiences a greater degree of deformation than the molding tool. In the case of the material that comprises a shape-memory material, this state can be achieved preferably by subjecting the material to a relatively high temperature or radiation, it being possible to select the associated value respectively for the temperature or for the radiation dose depending on the material used.

Second state: In what is known as a "second state", a temporary or permanent plastic deformation of the material which comprises a shape-memory material is possible at least in some cases. The second state is distinguished in particular in that there is at least one further state, which is referred to here as the "fourth state", or at least one outside action exists which can have the effect that the form of the shape-memory material that was defined in the second state can be at least partially restored solely by virtue of the shape-memory property.

Third state: In what is known as a "third state", a plastic or elastic deformation of the material which comprises the shape-memory material is possible. In particular, the third state differs from the second state in that, proceeding from deformations in the third state, the form defined in the second state can be restored solely by virtue of the shape-memory property.

Fourth state: In what is known as the "fourth state", the material which comprises the shape-memory material is present in such a manner that or experiences an outside action of this type such that the form of the shape-memory material that was defined in the second state can be at least partially restored solely by virtue of the shape-memory property. As already explained, here the "outside action" refers in particular to a change in temperature or an action of an electrical and/or magnetic field, in particular an electrical voltage or an electrical current, an electromagnetic field, in particular from light from the ultraviolet, visible and/or infrared spectral range, from local or two-dimensional forces, in particular from pressure fluctuations; from particle radiations or from chemical substances, in particular from solvents, on at least a part of the surface of the material. Depending on the shape-memory material used, the fourth state or the outside action described can either be retained until the operation of returning to the form starts or until the operation of returning to the form has concluded.

In a particular embodiment of the present invention, in this respect the first state and the third state can be identical to one another and/or the third state and the fourth state can be identical to one another and/or the first state and fourth state can be identical to one another.

In a particular embodiment, one or more of the states mentioned can have a local delimitation. In this respect, the material can preferably have a different state on the tool side than on the side facing away from the molding tool. This embodiment can be conducive in particular to carrying out the demolding operation. Furthermore, the molded body can have an additional functionality as a result, since surface properties can thus preferably be restricted to a specific range, for example manifestation of a locally delimited wetting characteristic or locally delimited optical properties.

In a particularly preferred embodiment, shape-memory polymers which have at least two temperature ranges that are separate from one another and in each of which deformations into another state with a specific form can occur can be used for the present method. Shape-memory polymers of this type can have respectively two temperature ranges in which a plastic deformation can take place. Above a temperature $T_{trans}$, it is possible to define a temporary form which is stable below T. If the shape-memory polymer is heated to a temperature above $T_{trans}$, it returns autonomously to its permanent form. On the other hand, it is possible for the permanent form to be defined by way of plastic deformations above $T_{perm}$. In comparison with this, conventional technical thermoplastic polymers have merely a single temperature range in which plastic deformations can take place. Depending on the type of the shape-memory polymer used, a different number of temperature ranges of this type can exist, it being possible for the temperature ranges to extend over a variety of temperatures.

In a particularly preferred embodiment, the shape-memory material is a temperature-sensitive shape-memory material. Suitable in particular for this purpose are shape-memory polymers, preferably a thermoplastic polyurethane or a liquid crystal polymer. In particular the shape-memory polymers Tecoflex® (TFX) or Tecoplast® (TPL) are suitable for the present method. Other types of shape-memory polymers which have the properties specified above can, however, likewise be used.

Without being restricted to the following theoretical approach, different temperature ranges of this type can be based on the molecular structure of the shape-memory polymers. The molecules of the shape-memory polymers can have what are known as "hard segments" and "soft segments", which can also be referred to as "net points" and "switch points" and can be responsible for the permanent form and for temporary forms. The two segments can utilize a variety of mechanisms. The net points can result from covalent bonds or intermolecular forces that originate, for example, from crystalline regions. The switch segments can be other crystalline regions or other types of bonds which can fix the shape-memory polymer in the temporary form counter to an internal stress of the net points. If the shape-memory polymer is heated, these bonds can break down, as a result of which the shape-memory polymer is returned to its permanent form again by virtue of the internal stress retained by the net points.

According to step a), a molding tool which has at least one receptacle in which at least one material is introduced is provided. The term "molding tool" or "mold insert" relates to a mechanical tool which has a negative structure and can be transferred inversely to a material. In this respect, the material is located in a device of the molding tool that is referred to as a receptacle. The term "receptacle" refers here to a structure which is located in the molding tool and can be referred to as a cutout in a surface of the molding tool in a first embodiment, or as a structure protruding from the surface of the molding tool, or as any desired combination of the two embodiments, in a further embodiment. Consequently, the molding tool can create cavities, and/or protruding structures on the surface of the molded body, in a molded body produced thereby. The present method is suitable here in particular for a use of a molding tool which has structures preferably provided with undercuts, which can give rise in the molded body to cavities and/or correspondingly protruding structures on the surface of the molded body.

For the purpose of transferring the negative structure to the material as dimensionally accurately as possible, the material fills the receptacle of the molding tool at least partially, preferably completely, in such a manner that said material adjoins a surface of the receptacle in order to make it possible to reproduce the negative structure of the receptacle of the molding tool as precisely as possible. As already explained, the material comprises at least one shape-memory material, wherein the shape-memory material is present in the first state, with the result that it is less dimensionally stable than the molding tool used and therefore an action of force between the material and the molding tool preferably does not give rise to deformations of the molding tool, but rather of the material. In this way, damage to the molding tool during an operation of filling with the material can be prevented.

In this respect, the molding tool can in particular be a molding tool which comprises a metal, silicon, a silicon compound, in particular silicon dioxide, or a polymer. However, other types of molding tools are possible. It is preferably possible for the molding tool to be producible by means of 3D printing, the 3D printing having been carried out in the associated material, in particular in the metal or the polymer. As an alternative or in addition, it is possible for the molding tool to be producible lithographically, preferably 3D-lithographically, in particular by means of two-photon lithography and/or by means of interference lithography, and/or galvanically from an existing molded body. Other ways of producing the molding tool are conceivable.

As already explained, the material which is provided during step a) comprises the at least one shape-memory material. For this purpose, at least one shape-memory material or a mixture of various materials, at least one of which is a shape-memory material, can be introduced directly into the at least one receptacle of the molding tool. As an alternative or in addition, at least one starting material, in particular at least one so-called "precursor", can be introduced into the at least one receptacle of the molding tool, wherein the starting material can be transferred at least partially, preferably completely, into the at least one shape-memory material before step b) in an additional method step. In addition, it is possible for at least one component of the material provided during step a) to comprise particles, wherein the particles are preferably selected from microparticles or nanoparticles and in particular are non-magnetic particles. The term "particle" refers to particulate materials with a diameter over a delimited, preferably narrowly limited range, wherein "microparticles" typically have a diameter of 0.1 μm to 100 μm and "nanoparticles" typically have a diameter of 1 nm to 100 nm. The particles used in the present method are preferably particles which comprise carbon, silicon dioxide and/or a metal. For example, the particles can be gold particles, glass particles or carbon nanotubes. Other types of particles are possible. In this respect, the particles mentioned can have a variety of functionalities. Gold particles can, for example, be used for coloring and utilize plasmonic effects for this. Other metal particles can be used to improve the electrical and thermal conductivity. Carbon nanotubes can likewise be used for this purpose, but can in addition also increase the mechanical stability of the component in which they are embedded. Pulverized coal or carbon nanoparticles can be admixed for the purpose of light absorption. In particular, the particles can comprise optically active materials, as are used for example for the purpose of producing organic lasers. The use of optically active particles makes it possible to produce structures which can emit laser light when they are pumped from the outside by way of suitable measures.

Regardless of the nature of the provision, the at least one receptacle of the molding tool is filled with the material which comprises the at least one shape-memory material at least partially, preferably completely, in particular at the surface of said receptacle, at the conclusion of step a), before a molded body is created in the receptacle of the molding tool from the material according to step b). In this way, it can be ensured that the at least one negative form in the molding tool that is determined by the at least one receptacle can be reproduced as dimensionally accurately as possible on the molded body to be produced. In order to create the molded body, the shape-memory material is present in a second state, wherein a form is embossed into the created molded body in the shape memory material during the second state. In this respect, the shape-memory material can be transferred from the first state to the second state still during step a), in the form of an intermediate step between step a) and step b) and/or during step b). In particular, the shape-memory material, preferably a temperature-sensitive shape-memory material, can be transferred from the first state to the second state by virtue of subjecting the material to an elevated temperature in comparison with the first state. As an alternative, the material which comprises the shape-memory material can be filled into the receptacle of the molding tool already at the higher temperature, with the result that the shape-memory material is present at the higher temperature already at the start of step b). Other embodiments are possible.

During the second state, which the shape-memory material assumes during step b), a form which can also be referred to as the "target form" and which is preferably the permanent form of the shape-memory material is thus embossed into the molded body. The form can assume any desired embodiment and in particular have an undercut or at least one structure with an aspect ratio of at least 10, preferably of at least 100. As explained in the introduction, the term "undercut" refers here to a part of the molded body which cannot be demolded from the molding tool in a demolding direction. For example, the molded body can have structures, such as pyramids or cones, which taper toward the surface of the molded body. Furthermore, the term "aspect ratio" refers to a quotient which from a height of a structure with respect to an extent of the structure that is lateral to said height, which extent can be attached in particular to a surface of the molded body. For example, a molded body can have column-like elevations which have a height and a base and are attached to its surface, it being possible for the height to exceed the base by a factor of at least 10, preferably of at least 100. However, other embodiments are possible.

In order, however, to be able to perform a demolding operation, according to step c) the shape-memory material is transferred from the second state to a third state, in which the molded body can be deformed in such a manner that a demolding of the molded body from the receptacle of the molding tool is made possible. In this case, the embossing of the form of the molded body that took place in step b) and can also be referred to as "form programming" can be partially retained, the molded body having a higher elasticity in the third state of the shape-memory material in comparison with the second state, with the result that the deformability of the molded body, in particular at a location on the surface of the molded body at which an undercut or a structure with an aspect ratio of at least 10 occurs, nevertheless makes it possible to demold the molded body from the corresponding receptacle of the molding tool.

In a preferred embodiment, the shape-memory material can be transferred from the second state to the third state during step c) by virtue of an outside action, in particular by virtue of exposing the molded body to light during step c), by virtue of subjecting the molded body to a reduced temperature in comparison with the second state during step c), or by virtue of subjecting the molded body to a reduced degree of action of force in comparison with the second state during step c). A combination of the outside actions performed or other types of outside actions is possible, in particular depending on the shape-memory material selected.

However, by virtue of the demolding of the molded body according to step c), the form of the molded body can at least partially, preferably completely, change in such a manner that said form can deviate from the form of the molded body that was embossed in step b) (form programming). According to step d), the form (target form) of the molded body is thus at least partially, preferably completely, restored by transferring the shape-memory material from the third state to a fourth state, the fourth state of the shape-memory material being distinguished in that the molded body at least partially, preferably completely, resumes the form that was embossed during step b) (form programming). In this respect, the shape-memory material can be transferred from the third state to the fourth state preferably by virtue of an outside action, in particular depending on the shape-memory material selected, by virtue of exposing the molded body to light during step d) or by virtue of subjecting the molded body to an elevated temperature in comparison with the third state during step d). As an alternative, the shape-memory material can be transferred from the third state to the fourth state by leaving the molded body in standard conditions during step d).

In a particular embodiment of the present method, what is known as a "self-healing" of a further deformation of the form (target form) of the molded body that took place following step d) can be performed. A precondition for this is that intentional or inadvertently inflicted deformations do not take place in the second state of the shape-memory material. Subsequent to the deformation, the shape-memory material can be transferred back to the fourth state, in which the molded body then at least partially, preferably completely, resumes the form (target form). In this way, intentionally performed or inadvertently developed deformations of a molded body created according to the present method can be completely or at least partially removed again.

In a further aspect, the present invention relates to a molded body which can be produced by the present method or has been produced thereby. In particular, in this respect the molded body can have at least one undercut or at least one structure with an aspect ratio of at least 10, preferably of at least 100. For further details with regard to the molded body, reference is made to the rest of the description of the method.

Advantages of the Invention

The present invention has a series of advantages with respect to the manufacturing methods known from the prior art for manufacturing structures, in particular microstructures. The use proposed here of the various states of the shape-memory polymers in conjunction with synchronized method steps makes it possible for undercuts to be molded directly, as will be explained in more detail below. Suitable in particular are shape-memory polymers which have a high transmission at least over the visible spectral range and preferably also over the near infrared. As a result, the optical properties—by contrast with UV lithography—are not restricted by photoinitiators which remain in the material. Moreover, the proposed method can be carried out with conventional molding tools of metal, which are resistant to wear.

In particular, by contrast with DE 10 2007 061 342 A1, the production of structures with undercuts is possible according to the invention. The option specified therein for creating the permanent form of the thermoplastic shape-memory polymers by injection molding has already been known for some considerable time. This also applies to the programming of the shape-memory polymer that is described there, in particular to cold stretching, which can be used during the production of undercuts only in exceptional cases. In addition, the shape memory-polymer is restored there—by contrast with the present method—by means of one or more magnetic fields, which act on the magnetic material embedded in the shape-memory polymer. While the material in DE 10 2007 061 342 A1 is a composite material, which comprises a shape-memory polymer and a magnetic material which is embedded therein and can be in the form of particles, the material according to the present invention, i.e. both the at least one shape-memory material and the particles optionally introduced therein, is preferably non-magnetic and can therefore be selected from a far greater number of substances.

As a further difference in relation to the prior art, the shape-memory effect used here offers a further advantage by way of the option of what is known as a "self-healing". The structures created according to the invention retain their form as a restorable form, manifested as the permanent form of the material. If, after its production according to step d), a molded body is intentionally or inadvertently deformed in a state which is not the second in the embodiment with Tecoflex® or Tecoplast® at temperatures below the permanent deformation temperature the embossed form remains unaffected by this.

Consequently, the molded body can be returned to its original form again by transferring to the second state, in particular by virtue of heating, as a result of which the structure of the component as a whole is restored.

BRIEF DESCRIPTION OF THE FIGURES

Further details and features of the present invention will become apparent from the following description of preferred exemplary embodiments, in particular in conjunction with the dependent claims. In this respect, the respective features may be realized by themselves alone or together in combination with one another. The invention is not restricted to the exemplary embodiments.

The exemplary embodiments are schematically illustrated in the following figures. In this respect, the same reference numerals in the figures refer to identical or functionally identical elements and/or elements which correspond to one another in terms of their functions. In detail, in the Figures:

FIG. 1 shows a schematic illustration of the proposed method for producing a molded body according to steps a) to d) in FIGS. 1a to 1d;

DESCRIPTION OF THE EXEMPLARY EMBODIMENTS

FIG. 1 shows a schematic illustration of the proposed method 100 for producing a molded body 10.

Figure 2:
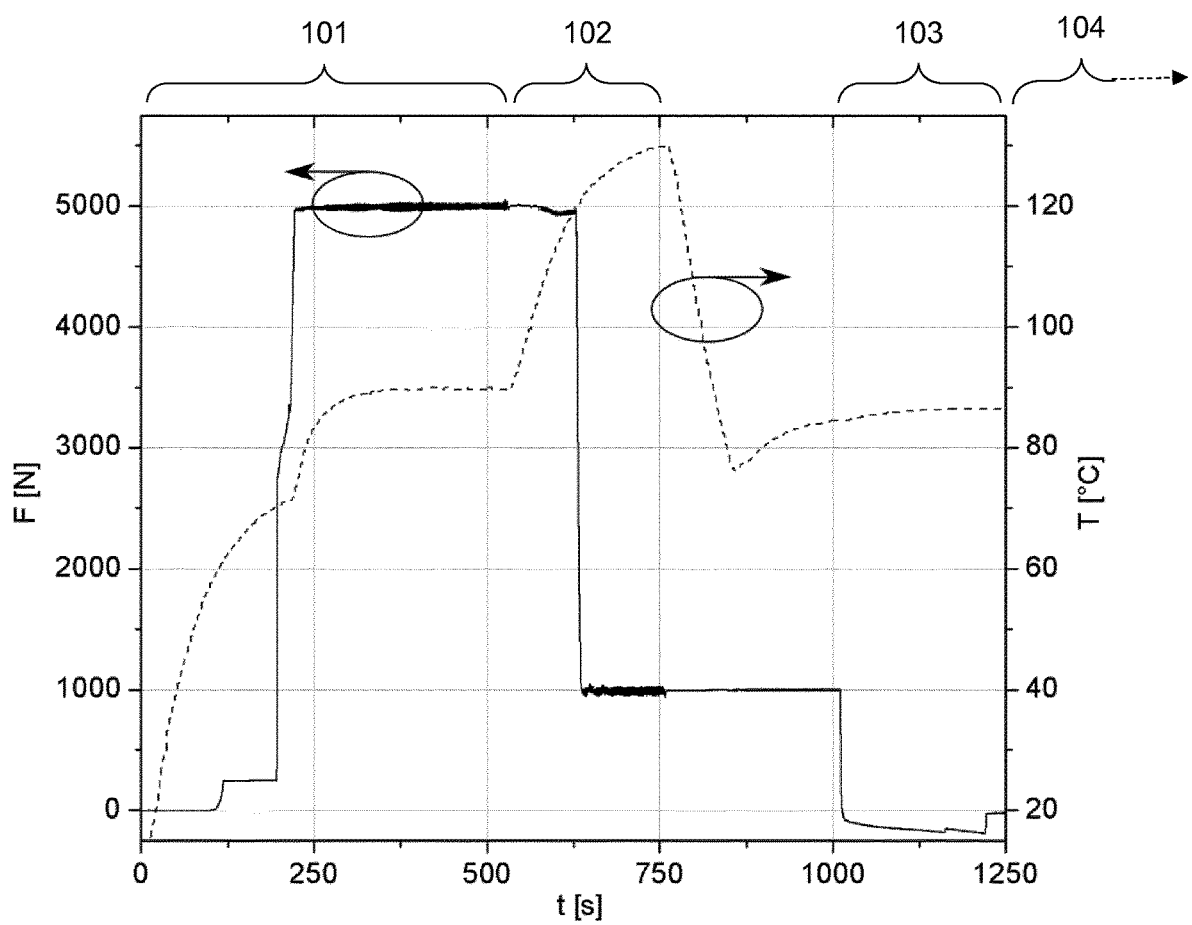
FIG. 2 shows a schematic illustration of the temporal change of the process parameters force F [N] (left-hand side; solid line) and temperature T [° C.] (right-hand side; dashed line) over the time sequence t [s] of a preferred embodiment of the present method.

As illustrated schematically in FIG. 1a, according to step a) 101, a molding tool 40 is provided which has at least one receptacle 12, which can also be referred to as a "cavity", in which at least one material 30 is introduced. In this respect, the material 30 comprises at least one shape-memory material 31 or a mixture 32 of various materials, at least one of which is a shape-memory material 31, which can be introduced directly into the receptacle 12 of the molding tool 40. As an alternative or in addition, at least one starting material 33, in particular a precursor, can be introduced into the receptacle 12 of the molding tool 40, wherein, before or during step b) 102 in an additional method step, the at least one starting material 33 can be transferred completely or at least partially into at least one shape-memory material 31. In tests, the results of which are illustrated in FIGS. 2-4, the shape-memory material 31 comprised the shape-memory polymer Tecoflex®. Other shape-memory materials, in particular other shape-memory polymers, are likewise possible.

In addition, at least one component of the material 30 provided during step a) 101 can comprise particles, in particular microparticles or nanoparticles, preferably non-magnetic particles, which preferably comprise carbon, silicon dioxide and/or a metal. For example, the particles can be gold particles, glass particles or carbon nanotubes. In particular, the particles can be optically active particles.

During step a) 101, the shape-memory material 31 is present in a first state 111, in which the material 30 which comprises the shape-memory material 31 or the at least one starting material 33 is less dimensionally stable than the molding tool 40. In this way, damage to the molding tool 40 during an operation of filling with the material 30 can be prevented. The arrows in FIG. 1a indicate a propagation direction and/or flow direction 41 along which the material 30 is introduced into the receptacle 12 of the molding tool 40 in such a manner that said material at least partially fills the receptacle 12 such that it finally adjoins at least one surface of the receptacle 12. This type of filling of the receptacle 12 of the molding tool 40 makes it possible to ensure that the negative form in the molding tool 40 that is determined by the receptacle 12 can be reproduced as dimensionally accurately as possible on the molded body 10 to be produced.

The sequence of step b) 102 is illustrated schematically in FIG. 1b. Here, a molded body 10 is created in the receptacle 12 of the molding tool 40 from the material 30. For this purpose, the shape-memory material 31 is brought into a second state 112, in which the form 11 of the molded body 10 is embossed in such a manner that said form can be restored at least partially by virtue of the shape-memory property at a later point in time after a deformation of the molded body 10. In this respect, the shape-memory material 31 can be transferred from the first state 111 to the second state 112 still during step a) 101, in the form of an intermediate step between step a) and step b) and/or during step b) 102. In particular, a temperature-sensitive shape-memory material 31, which can be transferred from to the second state 112 by virtue of subjecting the material 30 to an elevated temperature in comparison with the first state 111, can be used for this purpose. For example, the material 30, which comprises the shape-memory material 31, can be filled into the receptacle 12 of the molding tool 40 under standard conditions, i.e. at 20° C., and subsequently heated to a higher temperature, for example to 135° C. As an alternative, the material 30, which comprises the shape-memory material 31, can be filled into the receptacle 12 of the molding tool 40 already at the higher temperature, for example at 135° C., with the result that the shape-memory material 31 is present at the higher temperature already at the start of step b) 102. Other procedures are possible. During the second state 112, which the shape-memory material 31 assumes during step b) 102, the form 11 is thus embossed into the molded body 10. The form 11 of the molded body 10 can assume any desired embodiment and in particular have an undercut 20 or a structure with an aspect ratio of at least 10. However, other embodiments are possible.

As FIG. 1c schematically shows, according to step c) 103, the molded body 10 is demolded from the molding tool 40 in the demolding direction 43. However, in order to be able to perform a demolding operation, according to step c) 103, firstly the shape-memory material 31 is transferred from the second state 112 to a third state 113, in which the molded body 10 can be deformed in such a manner that it becomes possible for the molded body 10 to be demolded from the receptacle 12 of the molding tool 40 in the demolding direction 43. In this case, the embossing of the form 11 of the molded body 10 that took place in step b) 102 and can also be referred to as "form programming" can be at least partially retained, the molded body 10 having a higher elasticity in the third state 113 of the shape-memory material 31 in comparison with the second state 112. On account of the deformability of the molded body 10 thus realized, the demolding of the molded body 10 from the receptacle 12 of the molding tool 40 in the demolding direction 43 can also be made possible whenever an undercut 20 or a structure with an aspect ratio of at least 10 occurs at a location of the surface of the molded body 10.

In a preferred embodiment, an outside action can bring about the transfer, performed during step c), of the shape-memory material 31 from the second state 112 to the third state 113. For this purpose, in particular the molded body 10 can be exposed to light, the molded body 10 can be subjected to a reduced temperature in comparison with the second state 112, or the molded body 10 can be subjected to a reduced degree of action of force in comparison with the second state, for example by applying a negative pressure. In particular depending on the shape-memory material 31 used, a combination of the outside actions performed or other types of outside actions is also possible. Furthermore, the states occurring in the shape-memory material 31 can also be locally delimited, for example the second state 112 can be present on the molding tool side, while the stable state 110 is present on that side of the shape-memory material 31 which faces away from the molding tool 40.

FIG. 1d schematically shows the sequence of step d) 104, in which the form 11 of the molded body 10 that is illustrated in FIG. 1b is at least partially restored. For this purpose, the shape-memory material 31 is brought from the third state 113 into a fourth state 114. The shape-memory material 31 can be transferred from the third state 113 to the fourth state 114 during step d) preferably by leaving the molded body 10 in standard conditions during step d). As an alternative, an outside action can be performed depending on the shape-memory material 31 selected, in particular exposing the molded body 10 to electromagnetic radiation, in particular light, subjecting the molded body 10 to an elevated temperature in comparison with the third state 113 and/or applying a solvent to the molded body 10.

During the fourth state 114, as illustrated schematically by the arrows in the restoring direction 44 in FIG. 1d, the molded body 10 can thus autonomously completely or at least partially resume the form 11 embossed during step b) 102 on account of the shape-memory property of the shape-memory material 31 comprised therein. A form 13 of the molded body 10 that deviates from the form 11 of the molded body 12 that was embossed in step b) 102 by virtue of the demolding of the molded body according to step c) 103 can thus be completely or at least partially restored.

In a particular embodiment of the present method 100, what is known as a "self-healing" of a further deformation of the form 11 of the molded body 10 that took place following step d) can be performed. For the purpose of self-healing, the shape-memory material 31 can be transferred again to the fourth state 114, in which the molded body 10 then automatically completely or at least partially resumes the form 11. In this way, intentionally performed or inadvertently developed deformations of the molded body 10 can be completely or at least partially removed again.

FIG. 2 shows a temporal change of process parameters during a particular embodiment of the present method 100, in particular during production of free-standing lenses which have structures with undercuts 20. FIG. 2 shows on the one hand the profile of the temperature T [° C.] in the molding tool 40 (right-hand side; dashed line) and also on the other hand the profile of the force F [N] acting on the material 30 in the receptacle of the molding tool 40 (left-hand side; solid line) over the time sequence t [s] of a preferred embodiment of the present method 100. Steps a) to d) 101, 102, 103, 104 which were explained above in relation to FIG. 1 can be clearly seen and can be distinguished from one another only by typical heating and/or cooling periods.

For the present method 100, the known process of hot stamping or of thermal nanoimprinting was used for this purpose. For this, upright standing, biconvex optical lenses with focal lengths of 50 µm, 100 µm and 150 µm were respectively produced, which were respectively configured for a wavelength of 1550 nm. The material 30 comprised the shape-memory polymer Tecoflex®, which has a temporary transition temperature $T_{trans} \approx 55°$ C. and a permanent deformation temperature $T_{perm} \approx 105°$ C. For the molding tool 40, which had a surface area of $(15 \text{ mm})^2$, the lenses were produced by means of 2-photon lithography and then galvanically copied into the molding tool 40. After successful growth of the metal molding tool 40, all of the polymer residues were removed by plasma etching. For this purpose, a gas mixture of oxygen and chlorine was used at a temperature of 60° C. and a power of 1200 W over a period of one hour.

In particular, the shape-memory material 31 was brought initially to a temperature between the temporary transition temperature $T_{trans}$ and the permanent deformation temperature $T_{perm}$ in order to achieve an improved flow property of the shape-memory material 31. If step b) 102 is carried out at a temperature above the permanent deformation temperature $T_{perm}$, the shape-memory material 31 already has an excessively low viscosity, and therefore the shape-memory material 31 as a result preferably flows off perpendicular to the force applied, i.e. parallel to a surface of the molding tool 40, and cannot penetrate completely into the receptacle 12 or cavities of the molding tool 40. After a holding time of 300 s at a force of 5 kN on the surface area of $(15 \text{ mm})^2$, the shape-memory material 31 is brought to a temperature of 125° C., i.e. above the permanent deformation temperature $T_{perm}$. As a result, the molded body 10 takes on the form predefined by the receptacle 12 of the molding tool 40 as the form 11 of the shape-memory material 31. After this, the applied force is lowered to 1 kN in order to prevent the shape-memory material 31 from flowing off perpendicular to the direction of the applied force. The force can only prevent and/or compensate for a possible shrinkage of the shape-memory material 31. Finally, after a holding time of 120 s, the temperature was lowered to 75° C. such that it was possible to deform the shape-memory material 31 only temporarily. The molding tool 40 and a counter plate arranged opposite the receptacle 12 were moved apart from one another at a speed of 0.15 mm/min, as a result of which it was possible to separate and thus demold the molded body 10 from the molding tool 40. The final restoring step d) 104 took place here by virtue of heating the molded body 1) to a temperature above 50° C. but below 70° C., optionally in an oven or by applying a hot-air blower.

Figure 3A:
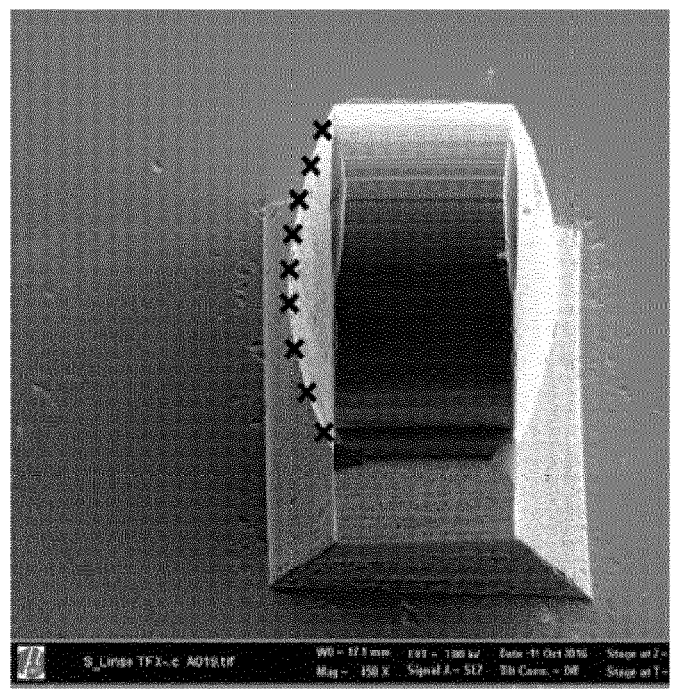
FIG. 3 shows a scanning electron recording of a structure which has been produced by the present method (FIG. 3a) and an illustration of the detection of its dimensional accuracy by means of measuring technology (FIG. 3b)
Figure 3B:
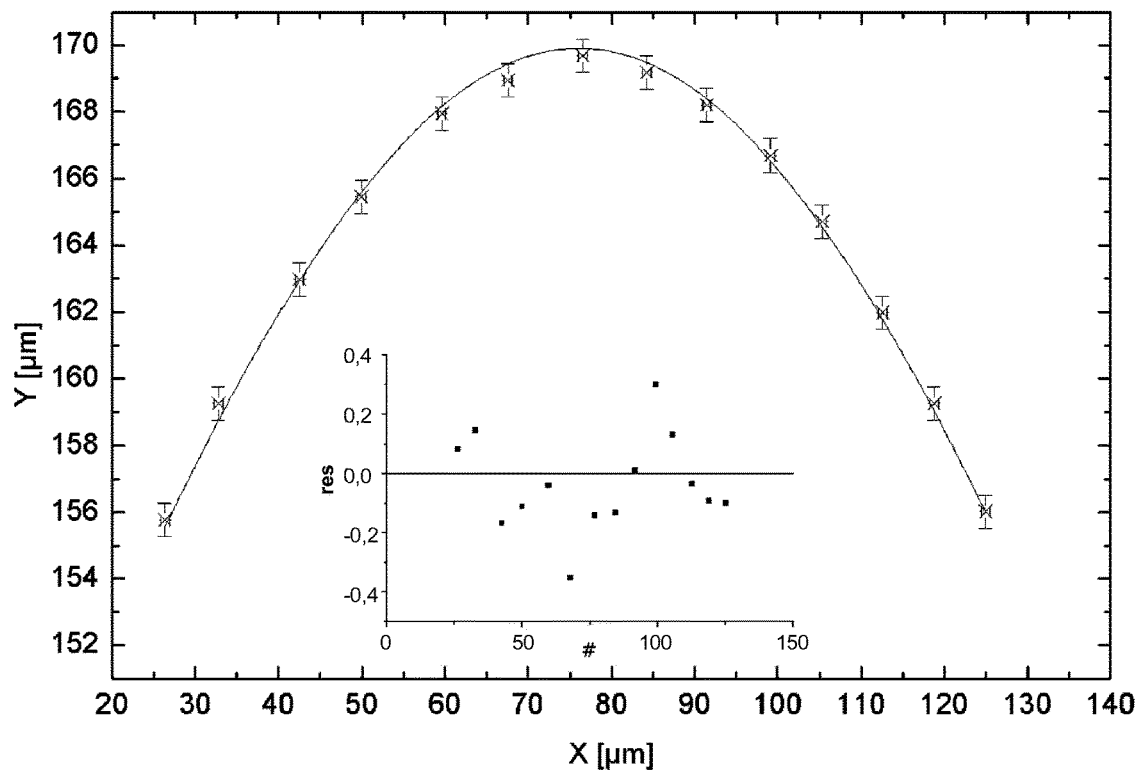

FIG. 3 shows a measurement of the dimensional accuracy of structures which were produced by the present method. A plurality of positions along a cross section of the molded body 10, which has been produced in the form of an optical lens, according to the scanning electron recording in FIG. 3a were determined and plotted in a graph according to FIG. 3b. The extent of the molded body 10 produced is plotted here in the form of values for a Y axis [µm] along the optical axis against values for an X axis [µm] along a diameter which is transverse to the optical axis. In the graph, the predefined desired structure is illustrated as a solid line and coincides with the measurements provided as a cross and error bar within the limits of a measurement error. In each case, the measuring points are specified with the form designed in CAD as a reference. The result was a coefficient of determination of $R^2 = (1 - 3.3 \cdot 10^{-3})$ between the measured points along the lens contour and the predefined contour in the original CAD structure. The differences illustrated during use in relation to FIG. 3b do not show any systematic deviations and once again confirm the dimensional accuracy of the optical lens produced by the present method. In addition to an aspect ratio of the optical lenses with values of 6 or 1.5, the result was an undercut ratio, which can be defined as the maximum width of the undercut 20 to the narrowest point of the structure below the undercut 20, with values of 3 or 1.5 respectively.

Figure 4A:
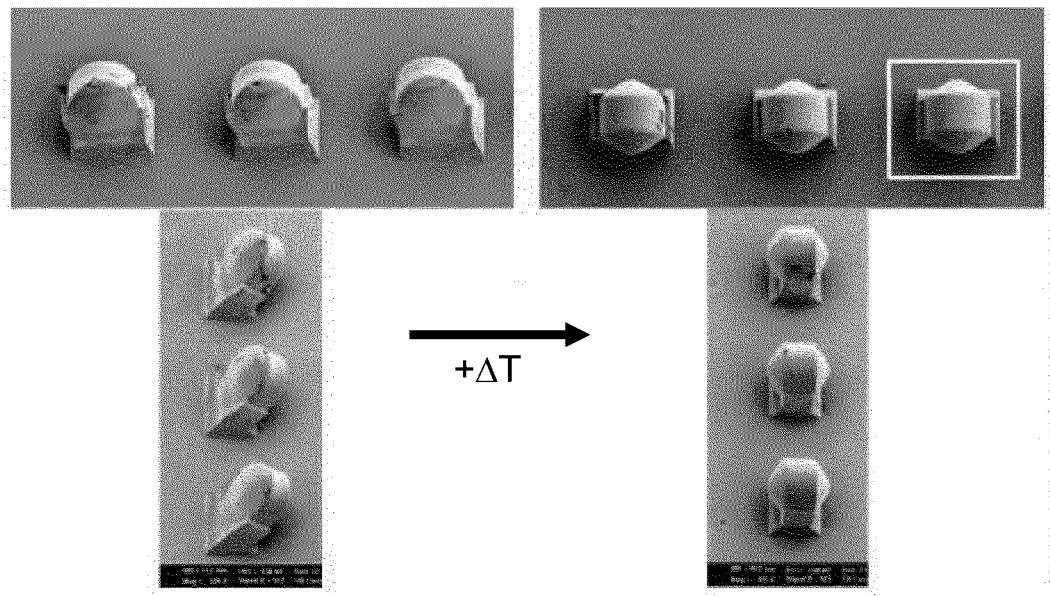
FIG. 4 shows scanning electron recordings of further structures which have been produced by the present method, subsequently deformed and finally restored by virtue of self-healing capability (FIG. 4a), and also an illustration of the detection of the surface of said further structures by means of measuring technology after restoration by virtue of self-healing capability (FIG. 4b).

It was also possible to confirm the self-healing properties of the optical lenses produced in this way experimentally. By way of example, FIG. 4 shows the self-healing capability of structures in the form of optical lenses which were produced by the present method. For this purpose, after their production according to the present method, the optical lenses were deformed to a great extent at room temperature, in both a tilted and also pinched and warped manner. The deformed and tilted lenses in the left half of FIG. 4a return to their original form 11 again after brief heating+ΔT, as is apparent from the right half of FIG. 4a. It was possible to completely reverse both the tilting of the entire optical lens and the deformed lens surface, with the result that it was possible to restore both the form 11 and the function of the structures. In this respect, the return was brought about by the optical lenses being brought into the fourth state 114 according to step d) 104. If the shape-memory material 31 is Tecoflex®, this corresponds to heating the molded body 10 to approx. 75° C. for at least 30 s. The time period until a complete return occurs depends here in particular on the geometry of the molded body 10, its absolute size and the degree of deformation.

Figure 4B:
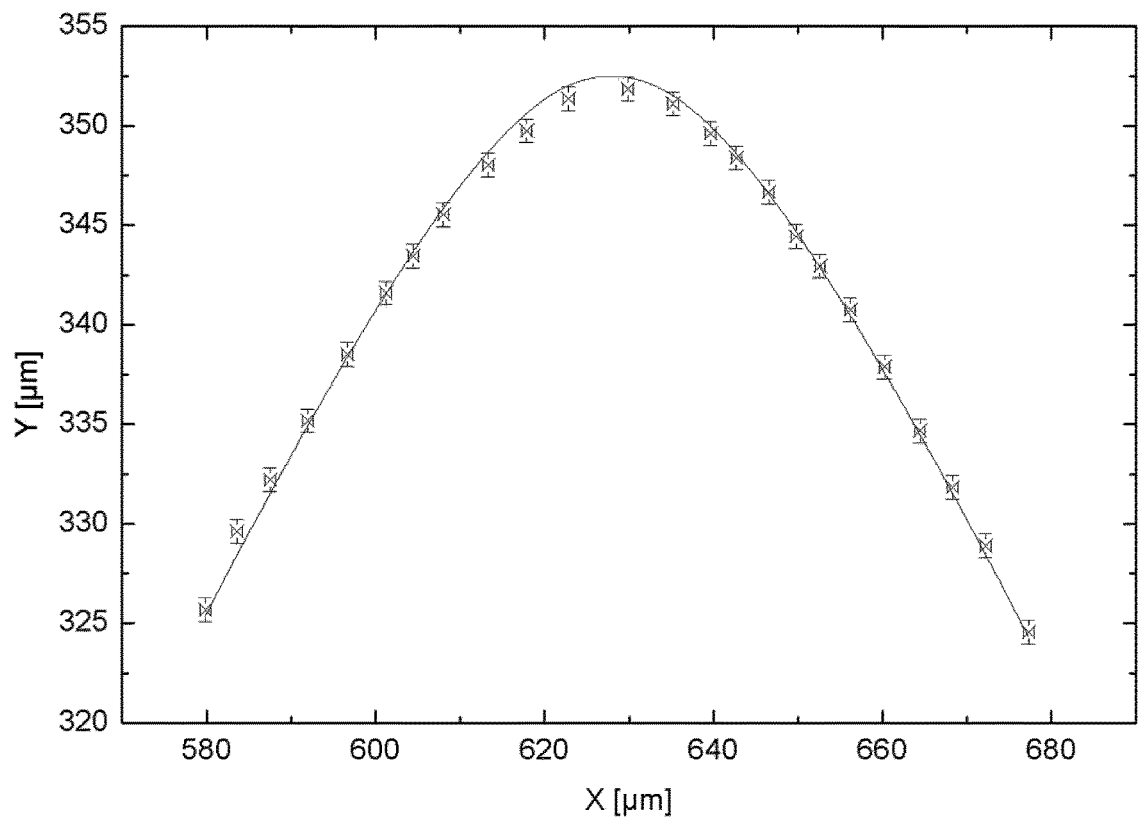

FIG. 4b shows an illustration of the detection of the lens surface by means of measurement technology after restoration by virtue of the self-healing capability. By analogy to FIG. 3b, the extent of the molded body 10 produced is also plotted here in the form of values for a Y axis [µm] along the optical axis against values for an X axis [µm] along a diameter which is transverse to the optical axis. The predefined desired structure also is illustrated as a solid line and coincides substantially with the measurements provided as a cross and error bar within the limits of a measurement error in the graph according to FIG. 4b.

LIST OF REFERENCE SIGNS

10 Molded body
11 Form
12 Receptacle (cavity)
13 Form as a consequence of demolding
20 Undercut
30 Material
31 Shape-memory material
32 Mixture of materials
33 Starting material
40 Molding tool
41 Propagation direction and/or flow direction
43 Demolding direction 44 Restoring direction
100 Method
101 Step a)
102 Step b)
103 Step c)
104 Step d)
110 Stable state
111 First state
112 Second state
113 Third state
114 Fourth state

The invention claimed is:

1. A method for producing a molded body, wherein the molded body comprises a micro-optical component having cavities or protruding structures on the surface of the molded body, the method comprising the following steps:
   a) providing a molding tool which has structures provided with undercuts giving rise in the molded body to cavities or protruding structures on the surface of the molded body, wherein the molding tool has at least one receptacle in which at least one material is being introduced, wherein the material comprises at least one shape-memory material, wherein the shape-memory material is present in a first state, wherein the material at least partially fills the receptacle of the molding tool in such a manner that said material adjoins at least one surface of the receptacle;
   b) creating a molded body in the receptacle of the molding tool from the material, wherein the shape-memory material is present in a second state, wherein a form is embossed into the molded body during the second state;
   c) transferring the shape-memory material from the second state to a third state, wherein the molded body can be deformed during the third state in such a manner that the molded body is demolded in demolding direction from the receptacle of the molding tool; and
   d) at least partially restoring the form of the molded body by transferring the shape-memory material from the third state to a fourth state, wherein the molded body at least partially resumes the form according to step b) during the fourth state.

2. The method of claim 1, wherein the material provided during step a) comprises non-magnetic particles which are selected from microparticles or nanoparticles.

3. The method of claim 2, wherein the particles comprise at least one of carbon, silicon dioxide or a metal.

4. The method of claim 2, wherein the particles are optically active.

5. The method of claim 1, wherein, at least one of during step a), or from step a) to step b), or during step b), the shape-memory material is transferred from the first state to the second state.

6. The method of claim 5, wherein the shape-memory material is transferred from the first state to the second state by virtue of subjecting the molded body to an elevated temperature in comparison with the first state.

7. The method of claim 1, wherein the shape-memory material is transferred from the second state to a third state during step c) by virtue of exposing the molded body to light, by virtue of subjecting the molded body to a reduced temperature in comparison with the second state or by virtue of subjecting the molded body to a reduced degree of action of force in comparison with the second state.

8. The method of claim 1, wherein the shape-memory material is transferred into the fourth state during step d) by virtue of exposing the molded body to light, by virtue of subjecting the molded body to a changed temperature in comparison with the third state or by virtue of leaving the molded body under standard conditions.

9. The method of claim 1, wherein the molded body, after a further deformation of the form that took place following step d) by virtue of transferring the shape-memory material into the fourth state again, at least partially resumes the form.

10. The method of claim 1, wherein the shape-memory polymer is a thermoplastic polyurethane.

11. The method of claim 1, wherein the method comprises a process of hot stamping or a process of thermal nanoimprinting.

12. The method of claim 1, wherein at least one negative form in the molding tool that is determined by the at least one receptacle is reproduced dimensionally accurately on the molded body to be produced.

* * * * *